United States Patent [19]
Haase et al.

[11] Patent Number: 5,974,070
[45] Date of Patent: Oct. 26, 1999

[54] II-VI LASER DIODE WITH FACET DEGRADATION REDUCTION STRUCTURE

[75] Inventors: Michael A. Haase, Woodbury; Paul Frederic Baude, Maplewood, both of Minn.

[73] Assignee: 3M Innovative Properties Company, St. Paul, Minn.

[21] Appl. No.: 08/972,025

[22] Filed: Nov. 17, 1997

[51] Int. Cl.$^6$ .................................................. H01S 3/19
[52] U.S. Cl. .............................................. 372/49; 372/50
[58] Field of Search ................................ 372/49, 46, 45, 372/50

[56] References Cited

U.S. PATENT DOCUMENTS

| | | | |
|---|---|---|---|
| 4,608,697 | 8/1986 | Coldren | 372/50 |
| 4,764,934 | 8/1988 | Kwong et al. | 372/49 |
| 5,165,105 | 11/1992 | Haase et al. | 385/8 |
| 5,396,103 | 3/1995 | Oiu et al. | 257/744 |
| 5,513,199 | 4/1996 | Haase et al. | 372/44 |

FOREIGN PATENT DOCUMENTS

| | | |
|---|---|---|
| 0 574 947 A1 | 12/1993 | European Pat. Off. . |
| 0 605 051 A1 | 7/1994 | European Pat. Off. . |
| 3916964 A1 | 11/1990 | Germany . |
| 01319986 | 12/1989 | Japan . |
| 07066494 | 3/1995 | Japan . |
| 08097518 | 4/1996 | Japan . |
| WO 97/50159 | 12/1997 | WIPO . |

OTHER PUBLICATIONS

Herrmann, F. U., et al: "Reduction of Mirror Temperature in GaAS/AlGaAs Quantum Well Laser Diodes with Segmented Contacts," Applid Physics Letters, vol. 58, No. 10, Mar. 11, 1991, pp. 1007–1009, XP000208585.

*Reliability and Degradation of Semiconductor Lasers and LEDs,* Mitsuo Fukuda, pp. 128–136. (1991) no month available.

*IEEE Photonics Technology Letters,* "InGaAs–GaAs Quantum–Well Lasers with Monolithically Integrated Intracavity Electroabsorption Modulators by Selective–Area MOCVD", vol. 8, No. 1, R.M. Lammert et al., Jan. 1996, pp. 78–80.

*Primary Examiner*—Rodney Bovernick
*Assistant Examiner*—Quyen Phan Leung
*Attorney, Agent, or Firm*—Charles L. Dennis II

[57] ABSTRACT

A II–VI semiconductor laser diode having a semiconductor body comprising a plurality of semiconductor layers forming a pn junction, a facet at one end of the body, and a reference electrode. The laser diode further includes a facet degradation reduction electrode located adjacent to the facet. The facet degradation reduction electrode is electrically isolated from a forward bias electrode. The facet degradation reduction electrode is used to establish an electric field sufficient to reduce facet degradation. In one embodiment, this electric field is established by applying a reverse-bias voltage between the facet electrode and the reference electrode. In another embodiment, this electric field is established by electrically connecting the facet electrode to the reference electrode.

41 Claims, 6 Drawing Sheets

II-VI LASER DIODE WITH FACET DEGRADATION REDUCTION STRUCTURE

GOVERNMENT RIGHTS

The United States government has certain rights in this invention pursuant to Contract No. DAAH04-94-C-0049 awarded by the Advanced Research Projects Agency and the Department of the Army/Army Research Office.

FIELD OF THE INVENTION

The present invention relates generally to semiconductor laser diodes. In particular, the present invention is a II–VI semiconductor laser diode with structures for facet degradation reduction.

BACKGROUND OF THE INVENTION

Semiconductor laser diodes are generally known and disclosed, for example, in Chapter 12 of Sze, *Physics of Semiconductor Devices*, 2nd ed. pp. 681–742 (1981). Specifically, a II–VI semiconductor laser diode is disclosed in U.S. Pat. No. 5,513,199 issued to Haase et al.

Typically, semiconductor laser diodes include parallel facets that are formed when a plurality of semiconductor laser diodes are formed by cleaving a semiconductor crystal along the crystal's natural cleavage planes. The facets help confine light that is emitted by a pn junction located within the semiconductor laser diode. The facets help confine the emitted light by reflecting back into the semiconductor body a fraction of the light that otherwise would exit the semiconductor body. This reflection of the emitted light promotes a condition where the reflected light oscillates within the semiconductor body. This oscillation condition is necessary for the semiconductor to operate as a laser.

Facet degradation processes are well known in III–V semiconductor laser diodes and are associated with oxidation of the facet. Oxidation is a condition where an oxide film grows on the facet when the facet is exposed to the ambient environment. It is believed that oxidation of the facet is enhanced by laser light that is reflected by the facet. When the facet oxidizes, elements of the semiconductor (e.g., Ga or As) are nonuniformly removed from the semiconductor body to form the oxide film. This leaves behind defects in the semiconductor body which cause a portion of the emitted light to be absorbed in a process referred to as nonradiative recombination. In nonradiative recombination, the energy from the absorbed light is dissipated in part in the form of heat. When the laser diode is operated at high output powers, the temperature increase at the facet due to nonradiative recombination can be large. If the temperature at the facet exceeds the melting point of the semiconductor material used to form the laser, rapid destruction of the facet occurs, which prevents the laser diode from operating. This destruction of the facet is referred to as catastrophic optical damage (COD). When COD occurs, fractures appear on a portion of the facet and a molten region penetrates into the semiconductor laser from the facet. The output power at which COD occurs tends to decrease as the laser ages due to increased oxidation of the facet.

In III–V semiconductor laser diodes, facet degradation is typically minimized by coating the facet with a dielectric material such as $Al_2O_3$ which effectively suppresses oxidation of the facet. This approach is described generally in Fukuda, *Reliability and Degradation of Semiconductor Lasers and LEDs*, pp. 134–136 (1991).

Conventional II–VI semiconductor laser diodes also exhibit a type of facet degradation. A gradual darkening of the semiconductor laser near the facet has been observed. After many minutes to an hour of operating a II–VI semiconductor at high output powers, it has been observed that this darkened region can extend up to 10 $\mu$ms from the facet. Eventually dark line defects usually grow out of the darkened region and result in functional destruction of the laser.

For II–VI semiconductor laser diodes, however, coating the facet with a dielectric, as is done with III–V semiconductor devices, is not sufficiently effective to reduce facet degradation to acceptable levels. Therefore, a new approach is needed to reduce facet degradation in II–VI semiconductor laser diodes.

SUMMARY OF THE INVENTION

The present invention is an improved II–VI semiconductor laser diode having structures which reduce facet degradation. The invention causes reduced nonradiative recombination in a region of an active layer near a facet in order to reduce facet degradation.

In one embodiment, the laser diode includes a semiconductor body comprising a plurality of semiconductor layers forming a pn junction, a facet at one end of the body, and a reference electrode. The laser diode further includes a facet degradation reduction electrode located adjacent to the facet. The facet degradation reduction electrode is electrically isolated from a forward bias electrode. The facet degradation reduction electrode is used to establish an electric field sufficient to sweep charge carriers (electrons and holes) out of a region adjacent to the facet in order to reduce nonradiative recombination near the facet. In one embodiment, this electric field is established by applying a reverse-bias voltage between the facet electrode and the reference electrode. In another embodiment, this electric field is established by electrically connecting the facet electrode to the reference electrode, e.g., by applying a conductive metal mirror coating to the facet in such a way that the coating is in electrical contact with both the facet electrode and the reference electrode.

In yet another embodiment, the laser diode includes a semiconductor body comprising a plurality of semiconductor layers forming a pn junction, a facet at one end of the body, and a reference electrode. The laser diode further includes a forward bias electrode that is electrically isolated from a region of an active layer near the facet, which reduces the number of injected carriers in the region. A gap etched into the semiconductor body isolates the forward bias electrode from this region.

An additional advantage of this invention is that the facet degradation reduction electrode can be used to monitor the output power of the laser diode. The photocurrent generated in a facet electrode bias circuit is proportional to the output power of the laser diode, and can be used in a feed-back circuit to control the laser diode. Using the facet degradation reduction electrode in this manner reduces the need for a separate photodiode that is typically used to monitor the output power of conventional laser diodes.

DETAILED DESCRIPTION OF THE PREFERRED EMBODIMENTS

Figure 1:
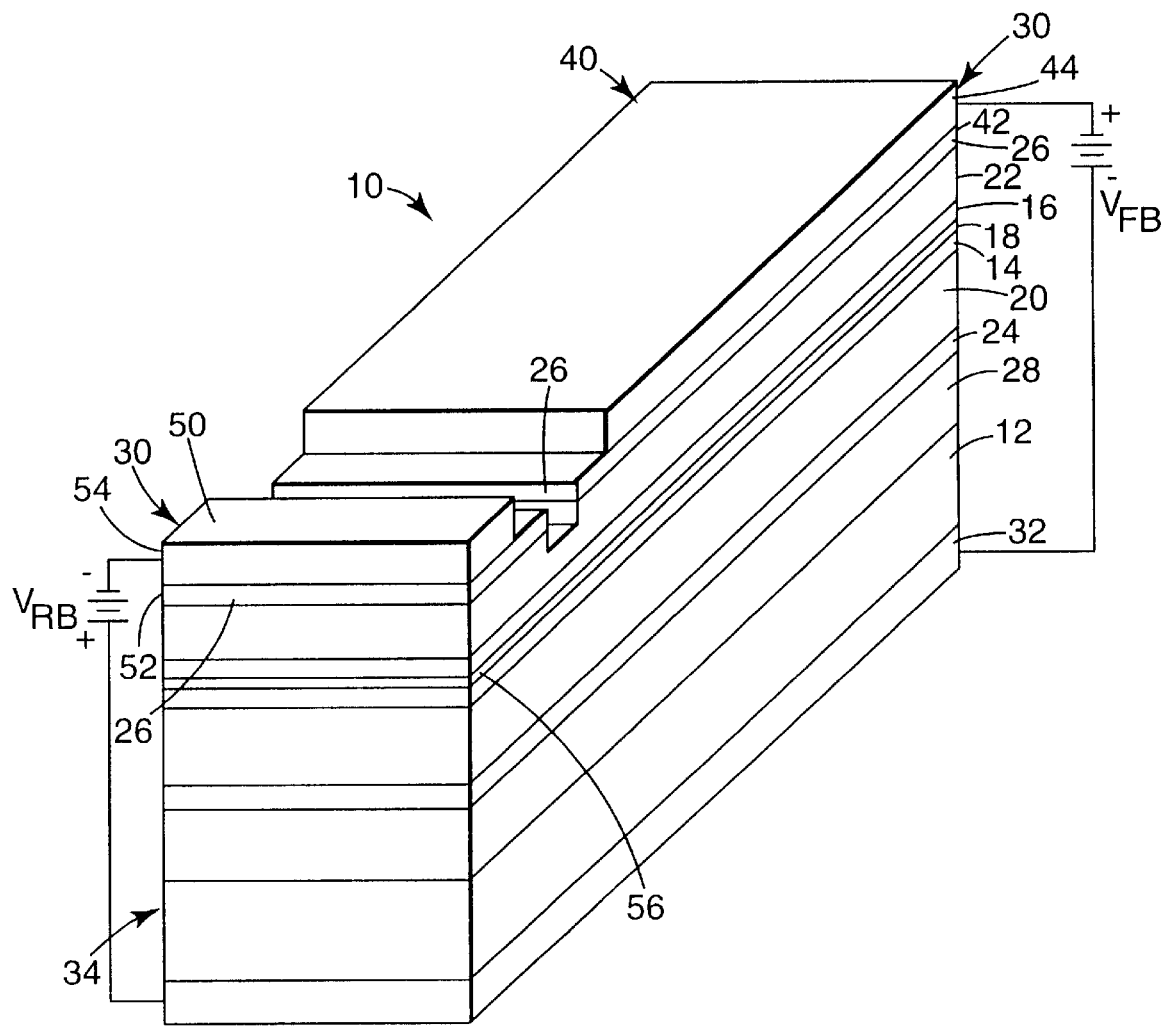
FIG. 1 is a cross-sectional isometric view (not to scale) of a II–VI semiconductor laser diode having a facet electrode in accordance with a first embodiment of this invention.

FIG. 1 is a cross-sectional isometric view of a II–VI semiconductor laser diode 10 having a facet electrode 50 according to the present invention. Laser diode 10 is fabricated on a GaAs substrate 12, and includes a pn junction formed by lower (first) and upper (second) ZnSSe wave guiding layers 14 and 16, respectively. A CdZnSe (or optionally CdZnSSe) quantum well active layer 18 is positioned between wave guiding layers 14 and 16 in the embodiment shown. However, active layer 18 can be positioned at other locations within layers 14 and 16 and adjacent the pn junction, and the active layer 18 can comprise multiple semiconductor layers. The surfaces of wave guiding layers 14 and 16 opposite active layer 18 are bounded by lower and upper MgZnSSe cladding layers 20 and 22, respectively. The illustrated embodiment of the laser diode 10 includes a GaAs buffer layer 28 which separates substrate 12 from a ZnSe buffer layer 24 to assure high crystalline quality of the ZnSe buffer layer 24 and subsequently deposited layers. A facet 34 is located at an end of the laser diode 10 and is perpendicular to the direction in which a coherent beam of laser light is emitted from the diode 10.

Electrical contact to the upper cladding layer 22 is made by a forward bias electrode 40 and a facet degradation reduction electrode 50. The forward bias electrode 40 includes a first portion 42 of an upper, digitally graded ZnTe (or alternatively BeTe) ohmic contact layer 26 positioned on a surface of the upper cladding layer 22. The forward bias electrode 40 also comprises a first portion 44 of a Pd—Au layer 30. These contact and Pd—Au layers 26 and 30 are adapted in a conventional manner so that the laser diode 10 can be coupled to an external system (not shown in FIG. 1).

The facet degradation reduction electrode 50 is located adjacent to the facet 34. The facet electrode 50 includes a second portion 52 of the upper contact layer 26 and a second portion 54 of the Pd—Au layer 30. The forward bias electrode 40 and the facet electrode 50 are electrically isolated from each other, preferably by an isolation etch 36 that forms a gap in the contact layer 26, the Pd—Au layer 30, and the upper cladding layer 22. In a preferred embodiment, the facet electrode 50 has a width in the range of about 2 μm to about 20 μm, the isolation etch 36 is stepped with a width in the cladding layer 26 of about 10 μm, while the forward bias electrode 40 has a surface area that is substantially larger than the surface area of the facet electrode 50. Alternatively, other conventional techniques, such as ion implantation and selective area growth, can be used to electrically isolate the forward bias electrode 40 and the facet electrode 50 from each other.

Electrical contact to the lower side of laser diode 10 is made by a reference electrode 32 on the surface of substrate 12 opposite the ZnSe buffer layer 24. The reference electrode 32 comprises In, Pd, Au, Ge, or a combination thereof.

The forward bias and reference electrodes 40 and 32 are adapted to receive and couple a forward bias electrical voltage $V_{FB}$ to the pn junction in order to generate the coherent beam of light. The facet and reference electrodes 50 and 32 are adapted to establish an electric field sufficient to sweep carriers out of a region 56 of the active layer 18 near the facet 34. This electric field can be established by applying a reverse-bias voltage $V_{RB}$ between the facet electrode 50 and the reference electrode 32. Sweeping carriers from this region 56 is believed to reduce nonradiative recombination near the facet 34 which results in reduced facet degradation. For example, experiments with prototype laser diodes have shown no facet degradation at 5 mW output power when a reverse bias voltage $V_{RB}$ around −3 V is applied. These experiments have also shown that at higher reverse bias voltage $V_{RB}$, the absorption of the laser light becomes greater due to increasing electroabsorption and the threshold current of the laser increases. This effect is negligible if the facet electrode voltage $V_{RB}$ is sufficiently small.

Figure 2:
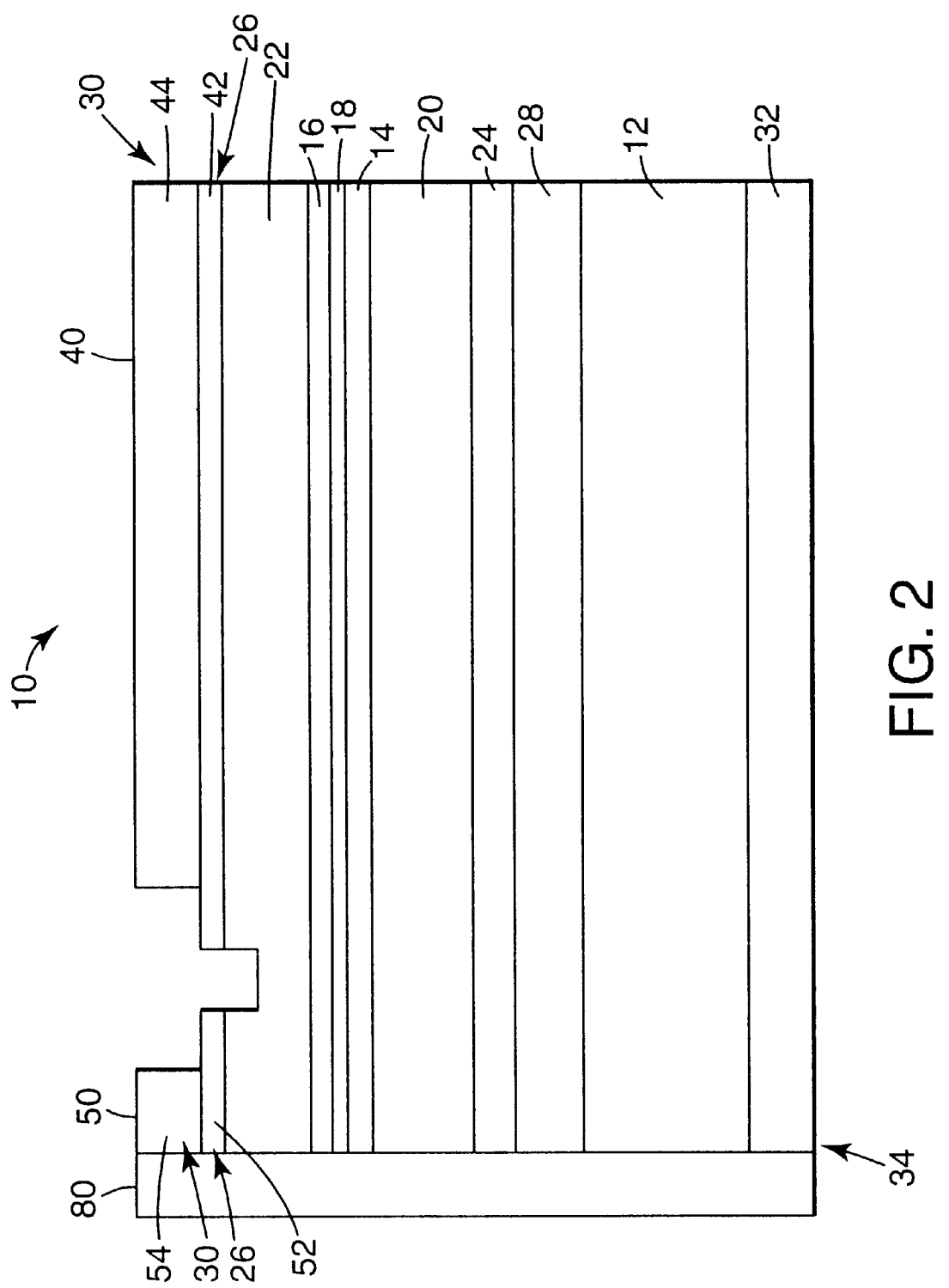
FIG. 2 is a cross-sectional isometric view of a II–VI semiconductor laser diode having a facet electrode electrically connected to a reference electrode in accordance with a second embodiment of this invention.

Experiments have shown that carriers are removed from the region 56 even at zero bias. Thus, as shown in FIG. 2, an appropriate sweeping electric field can be established by electrically shorting or connecting the facet electrode 50 to the reference electrode 32. In the embodiment shown, this connection is provided by applying a metal mirror coating 80 to the facet 34 that is in electrical contact with both the facet degradation reduction electrode 50 and the reference electrode 32.

Experiments have further shown that the desired results are achieved even when the facet electrode 32 is forward biased to a voltage sufficiently less than the diode turn-on voltage (approximately the quantum well band gap voltage). The effective removal of carriers from the region 56 of the active layer 18 near the facet 34 is easily observed by the absence of spontaneous emission near the facet electrode 50 and the establishment of a photocurrent flowing through the region 56 in a direction opposite that of the forward bias current flowing through the forward bias electrode 40.

Figure 3:
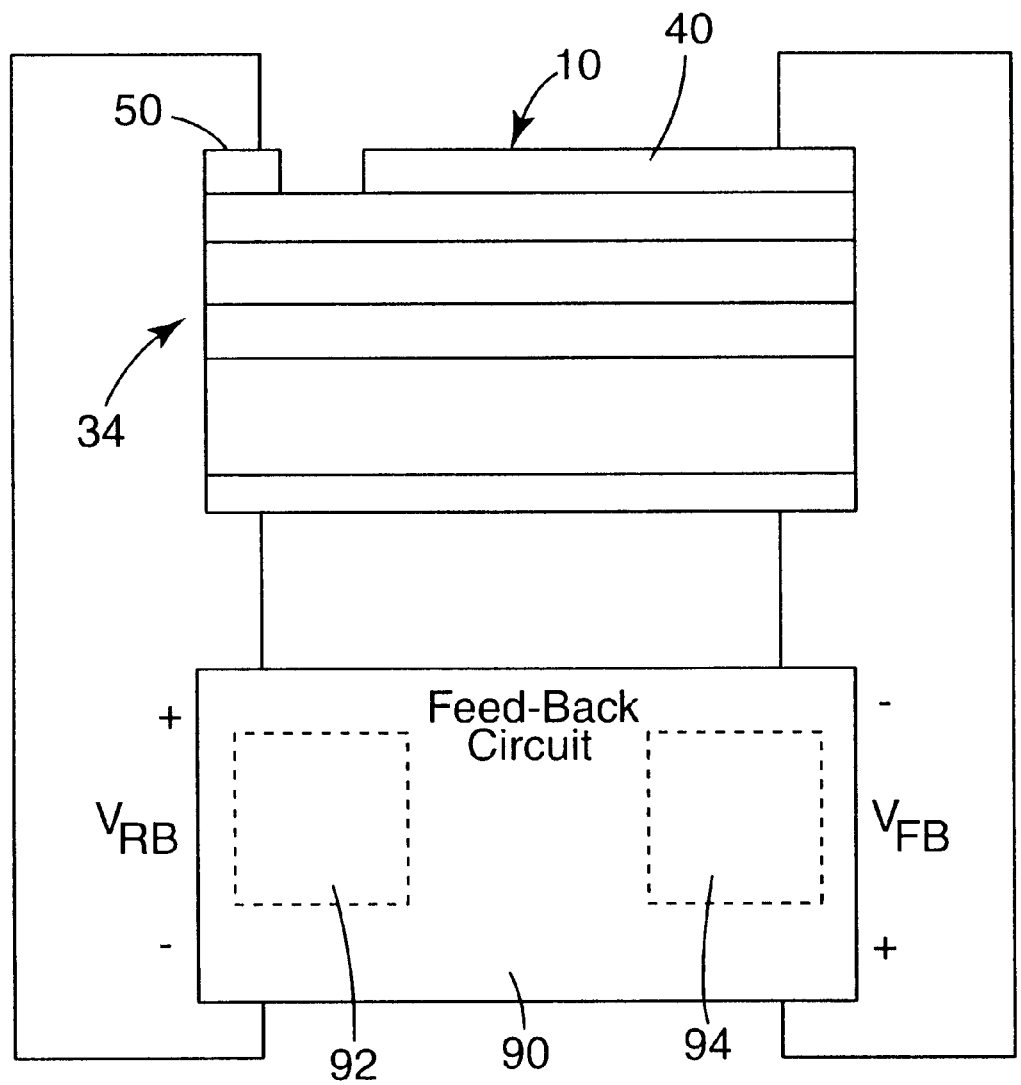
FIG. 3 is a block diagram of a II–VI semiconductor laser diode of the type shown in FIG. 1 having a facet electrode and interconnected to a feed-back circuit according to the present invention.

FIG. 3 is a cross-sectional isometric view of a laser diode 10 of the type shown in FIG. 1 interconnected to a feed-back circuit 90. The feed-back circuit 90 comprises a facet electrode biasing circuit 92 and a forward bias electrode biasing circuit 94. An additional advantage of the present invention is that the facet degradation reduction electrode 50 can be used to monitor output power of the laser diode 10. The photocurrent generated in the facet electrode bias circuit 92 is proportional to the output power of the laser diode 10, and can be used in a feedback circuit 90 to control the laser diode 10. Using the facet electrode 50 in this manner eliminates a separate photodiode (not shown) that is typically used to monitor the output power of a conventional laser diode. Feedback circuits are well known in the art. The feedback circuit 90, for example, could be designed to adjust the forward bias voltage $V_{FB}$ applied to the pn junction by circuit 94 based on the photocurrent in the facet electrode biasing circuit 92.

In general, prototypes of the laser diode 10 were fabricated using the processes disclosed in U.S. Pat. Nos. 5,513, 199 and 5,396,103 and U.S. Pat. No. 5,879,962 entitled BLUE-GREEN LASER DIODE, GRADED COMPOSITION OHMIC CONTACT FOR P-TYPE II–VI SEMICONDUCTORS, and IIIV/II–VI SEMICONDUCTOR INTERFACE FABRICATION METHOD, respectively, all of which are incorporated herein by reference. The isolation etch 36 is fabricated using conventional lithography and etching techniques that are well known in the art.

An alternative prototype laser diode 10 has been fabricated that includes cladding layers 20 and 22 comprising BeMgZnSe, wave guiding layers 14 and 16 comprising BeZnSe, and a quantum well active layer 18 comprising CdZnSe.

Figure 4:
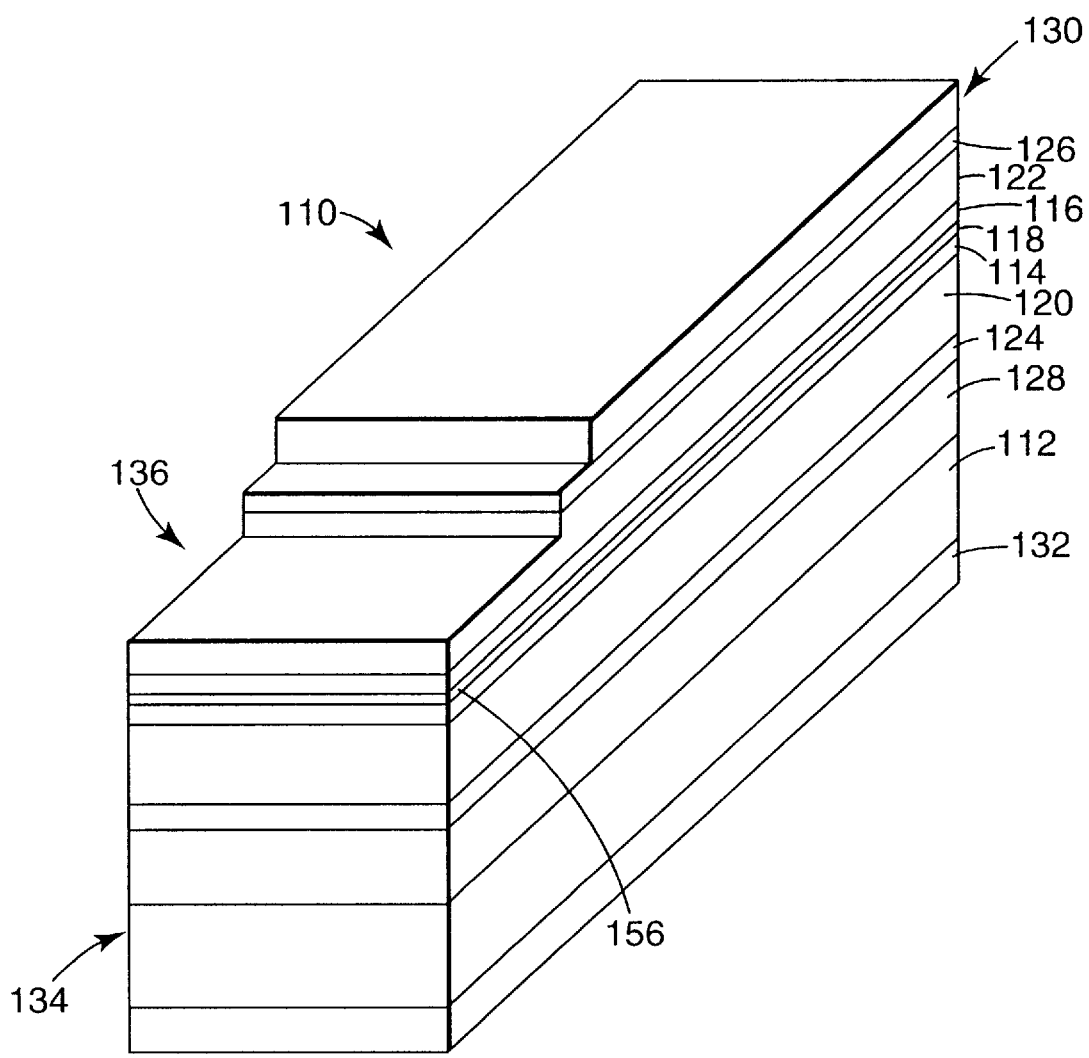
FIG. 4 is a cross-sectional isometric view of a II–VI semiconductor laser diode having a recessed forward bias electrode according to a third embodiment of this invention.

Laser diode 110, an alternative embodiment of the present invention, is shown in FIG. 4. Group II–VI semiconductor laser diode 110 is similar to the laser diode 10 and can be fabricated with the same II–VI semiconductor layers and processes. Portions of the laser diode 110 that correspond with laser diode 10 are indicated with reference numerals that are incremented by 100 (e.g., a facet 134 of laser diode 110 corresponds to the facet 34 of laser diode 10). The laser diode 110 differs from the laser diode 10 in that the laser diode 110 has no facet electrode and therefore no reverse bias voltage $V_{RB}$ is applied. The laser diode 110 has an isolation etch 136 that extends from an edge of a forward bias electrode 140 to an edge adjacent to a facet 134. The isolation etch 136 electrically isolates a region 156 of an active layer 118 near the facet 134 from the forward bias electrode 140. It is believed that electrically isolating this region 156 reduces the number of carriers injected into the region and leads to a reduction in nonradiative recombination in the region 156. It is believed that the reduction of nonradiative recombination in the region 156 leads to a reduction in facet degradation.

Figure 5:
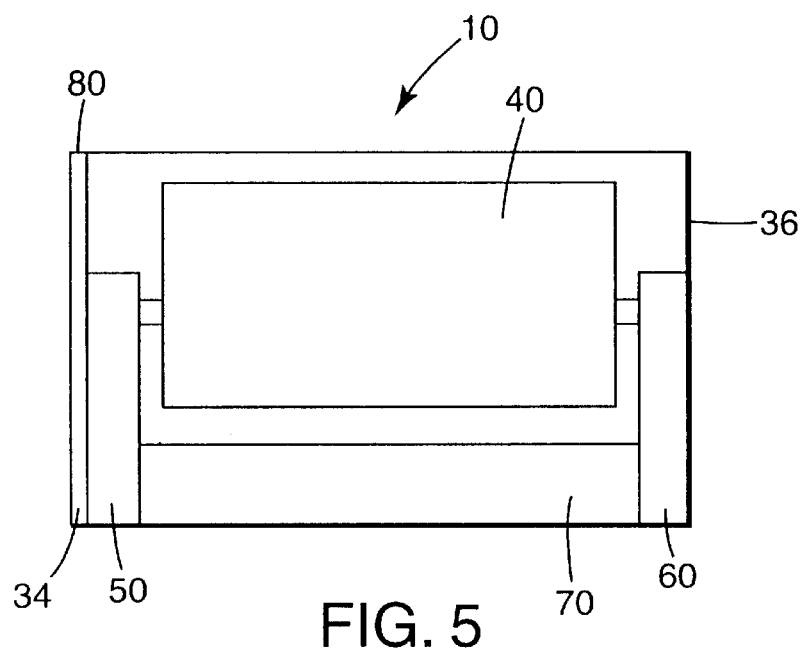
FIG. 5 is a top view of a II–VI semiconductor laser diode of the type shown in FIG. 1 further comprising a second facet electrode according to the present invention.

Although the laser diode 10 is shown in FIGS. 1–3 with only one facet 34, the laser diode 10, as shown in FIG. 5, would typically comprise a second facet 36 with a second facet degradation reduction electrode 60 electrically isolated from the forward bias electrode 40. In a preferred embodiment shown in FIG. 5, a metal strip 70 is formed on the semiconductor body in order to electrically connect the two facet electrodes 50 and 60 to each other. The facet 34 is coated with a metal mirror coating 80 so as to electrically connect the facet electrodes 50 and 60 to the reference electrode 32. Alternatively, instead of using the metal strip 70 to connect the second facet electrode 60 to the reference electrode 32, a second mirror coating similar to the mirror coating 80 shown in FIG. 2 can be applied to the second facet 36 so that the second facet electrode 60 is electrically connected to the reference electrode 32. In one embodiment (not shown) having two coated facets, one facet is coated with a highly reflective conductive coating, (e.g., Ag) and the other facet is coated with a thin metal coating, (e.g., Zr because of its relatively low absorption coefficient at green wave lengths) so as not to reduce laser efficiency.

In a similar fashion, the laser diode 110 shown in FIG. 4 can have a second facet similar to the facet 134. An isolation etch similar to the isolation etch 136 shown in FIG. 4 can be used to electrically isolate a region of the active layer 128 near the second facet from the forward bias electrode 140 so as to reduce degradation of the second facet.

Figure 6:
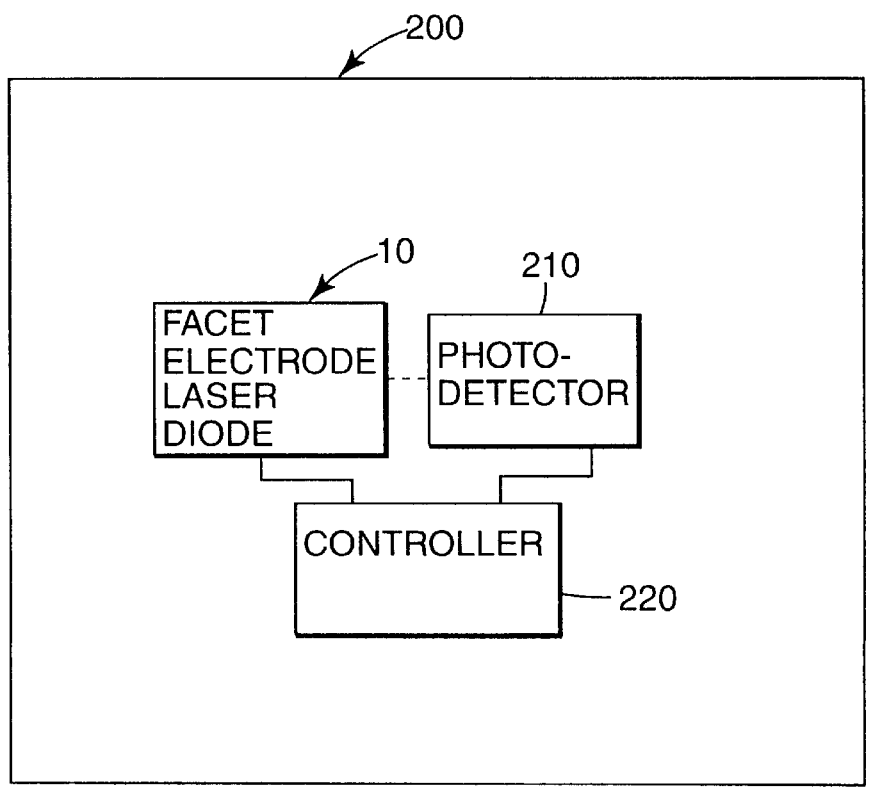
FIG. 6 is a block diagram of a electronic system having a II–VI semiconductor laser diode according to the present invention.

FIG. 6 is a block diagram of an electronic system 200 having a laser diode 10 (or 110). The electronic system 200 typically includes a controller 220 of conventional design that is adapted to operate the laser diode 10. Optionally, the electronic system 200 can further include a photodetector 210 of conventional design that is adapted to receive and detect the laser beam emitted by the laser diode 10. The photodetector 210 is in electrical communication with the controller 220 and sends a signal to the controller 220 indicating whether or not the photodetector 210 has detected the emitted laser beam. The electronic system 200 can be any type of electronic system having a laser diode of the present invention. Preferred embodiments of the electronic system 200 include optical data storage systems, optical communications systems, electronic display systems, and laser pointer systems.

Figure 7:
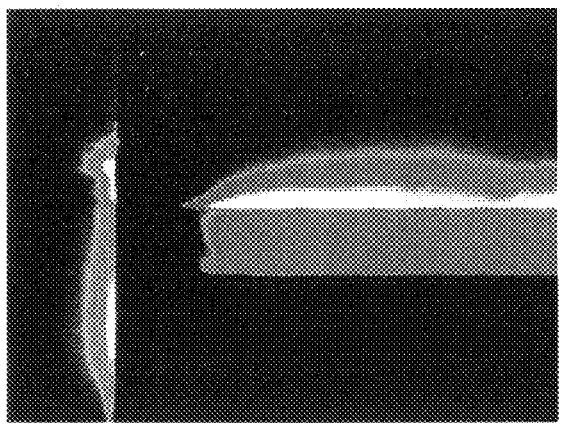
FIGS. 7-8 are top view photographs showing electroluminescence from two facets of a single protlotype laser diode having one facet (shown in FIG. 7) without a facet degradation reduction structure and second facet (shown in FIG. 8) with a facet degradation reduction electrode of the type shown in FIG. 1.
Figure 8:
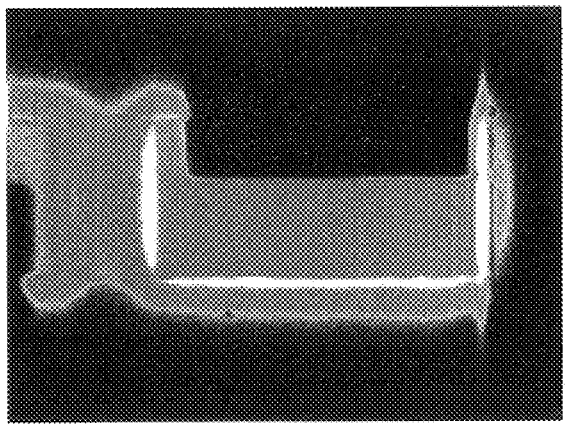

FIGS. 7-8 are top view photographs showing electroluminescence from two facets of a single prototype laser diode having one facet (shown in FIG. 7) without a facet degradation reduction structure and second facet (shown in FIG. 8) with a facet degradation reduction electrode of the type shown in FIG. 1. The prototype laser diode has a total length of about 1000 μm and an active stripe with a width of about 20 μm. The diode was operated for about ten minutes at a relatively high current with the facet electrode reverse biased. FIGS. 7-8 were taken while the laser diode was operated in a display mode with the facet electrode forward biased. Bonding pads partially obscure a bottom portion of the active stripe shown in FIG. 7 and a top portion of the active stripe shown in FIG. 8. FIG. 7 shows a darkened region of the active stripe near the facet indicating that the diode has started to fail at the facet without a facet degradation reduction structure. FIG. 8 shows no darkening of the active stripe near the facet with the facet electrode demonstrating that the facet electrode has effectively reduced facet degradation at that facet.

Although the present invention has been described with reference to preferred embodiments, those skilled in the art will recognize that changes may be made in form and detail without departing from the spirit and scope of the invention.

What is claimed is:

1. A II–VI compound semiconductor laser diode, including:

a semiconductor body comprising:
        a substrate; and
        a pn junction including an active layer of II–VI semiconductor on the substrate having a first surface facing the substrate and a second surface opposite the first surface;
    a first facet on a first end of the semiconductor body;
    a reference electrode on the semiconductor body in electrical contact with the first surface of the active layer;
    a forward bias electrode on the semiconductor body in electrical contact with the second surface of the active layer for receiving and coupling to the active layer a first electrical energy that establishes a first current and generates light; and
    a first facet electrode on the semiconductor body adjacent to the first facet, the first facet electrode in electrical contact with the second surface of the active layer and electrically isolated from the forward bias electrode for receiving and coupling to the active layer in a region adjacent to the first facet a second electrical energy that establishes a second current flowing in a direction opposite the first current in order to reduce facet degradation on the first facet.

2. The laser diode of claim 1 wherein the semiconductor body further includes:

a first cladding layer of II–VI semiconductor between the substrate and the active layer; and a second cladding layer of II–VI semiconductor opposite the active layer from the first cladding layer.

3. The laser diode of claim 2 wherein the semiconductor body includes a first isolation etch in the second cladding layer between the forward bias and first facet electrodes.

4. The laser diode of claim 3 further including:
a second facet on a second end of the semiconductor body opposite the first facet; and
a second facet electrode on the semiconductor body adjacent to the second facet, the second facet electrode in electrical contact with the second surface of the active layer and electrically isolated from the forward bias electrode for receiving and coupling the second electrical energy to the active layer adjacent to the second facet to reduce facet degradation on the second facet.

5. The laser diode of claim 4 wherein the semiconductor body includes a second isolation etch in the second cladding layer between the forward bias electrode and the second facet electrode.

6. The laser diode of claim 5 wherein the first and second isolation etches are about 10 $\mu$m wide.

7. The laser diode of claim 4 wherein the first and second facet electrodes have a width in the range of about 2 $\mu$m to about 20 $\mu$m.

8. The laser diode of claim 4, further including a facet connection strip formed on the semiconductor body and electrically connecting the first and second facet electrodes.

9. The laser diode of claim 8, further including a conductor for electrically connecting the first facet electrode to the reference electrode.

10. The laser diode of claim 2 wherein the semiconductor body further includes one or more wave guiding layers of II–VI semiconductor adjacent to the active layer and between the cladding layers.

11. The laser diode of claim 10 wherein:
the first and second cladding layers include a MgZnSSe layer;
the wave guiding layers include a ZnSSe layer; and
the active layer includes a CdZnSSe layer.

12. The laser diode of claim 10 wherein:
the first and second cladding layers include a BeMgZnSe layer;
the wave guiding layers include a BeZnSe layer; and
the active layer includes a CdZnSe layer.

13. The laser diode of claim 10 wherein the active layer includes a multiple quantum well active layer.

14. The laser diode of claim 10 wherein the semiconductor body further includes a ohmic contact layer between the second cladding layer and the forward bias electrode.

15. The laser diode of claim 14 wherein the contact layer includes a digitally graded ZnTe layer.

16. The laser diode of claim 14 wherein the contact layer includes a digitally graded BeTe layer.

17. The laser diode of claim 1 wherein the semiconductor body includes a first ion implantation isolation region in the semiconductor body between the forward bias and first facet electrodes.

18. The laser diode of claim 1 wherein the semiconductor body includes a first selective area growth isolation region in the semiconductor body between the forward bias and first facet electrodes.

19. The laser diode of claim 1 further including a conductor for electrically connecting the first facet electrode to the reference electrode.

20. The laser diode of claim 19, wherein the conductor includes a metal mirror coating covering a portion of the first facet and providing an electrical contact between the first facet electrode and the reference electrode.

21. The laser diode of claim 20 wherein the metal mirror coating comprises zirconium.

22. The laser diode of claim 20 wherein the metal mirror coating comprises silver.

23. The laser diode of claim 1, further including a feed-back circuit in electrical communication with the first facet electrode for monitoring the output power of the laser diode.

24. An electronic system including the laser diode of claim 1 as a light source.

25. The electronic system of claim 24, further including a voltage supply adapted to supply the second electrical energy to the first facet electrode.

26. The electronic system of claim 24, wherein the electronic system comprises an optical data storage system.

27. The electronic system of claim 24, wherein the electronic system comprises an optical communications system.

28. The electronic system of claim 24, wherein the electronic system comprises an electronic display system.

29. The electronic system of claim 24, wherein the electronic system comprises a laser pointer system.

30. A II–VI compound semiconductor laser diode, including:
a semiconductor body comprising:
a substrate; and
a pn junction including an active layer of II–VI semiconductor on the substrate having a first surface facing the substrate and a second surface opposite the first surface;
a first facet on a first end of the semiconductor body;
a reference electrode on the semiconductor body in electrical contact with the first surface of the active layer;
a forward bias electrode on the semiconductor body in electrical contact with the second surface of the active layer for receiving and coupling an electrical energy to the active layer to generate light; and
a first isolation region electrically isolating the forward bias electrode from the first facet for reducing facet degradation on the first facet.

31. The laser diode of claim 30 wherein the semiconductor body further includes:
a first cladding layer of II–VI semiconductor between the substrate and the active layer; and
a second cladding layer of II–VI semiconductor opposite the active layer from the first cladding layer.

32. The laser diode of claim 31 further including:
a second facet on a second end of the semiconductor body opposite the first facet; and
a second isolation region electrically isolating the forward bias electrode from the second facet for reducing facet degradation on the second facet.

33. The laser diode of claim 32, wherein the first isolation region comprises a first isolation etch and the second isolation region comprises a second isolation etch.

34. The laser diode of claim 33, wherein the first and second isolation etches have widths in the range of about 2 $\mu$m to about 20 $\mu$m.

35. The laser diode of claim 32, wherein the first isolation region comprises a first ion implantation region and the second isolation region comprises a second ion implantation region.

36. The laser diode of claim 32, wherein the first isolation region comprises a first selective growth region and the second isolation region comprises a second selective area growth region.

37. An electronic system including the laser diode of claim 30 as a light source.

38. The electronic system of claim 37, wherein the electronic system comprises an optical data storage system.

39. The electronic system of claim 37, wherein the electronic system comprises an optical communications system.

40. The electronic system of claim 37, wherein the electronic system comprises an electronic display system.

41. The electronic system of claim 37, wherein the electronic system comprises a laser pointer system.

* * * * *